United States Patent [19]

Itaya et al.

[11] Patent Number: 5,459,746
[45] Date of Patent: Oct. 17, 1995

[54] SURFACE EMISSION TYPE SEMICONDUCTOR LIGHT-EMITTING DEVICE

[75] Inventors: Kazuhiko Itaya, Goleta, Calif.; Hideto Sugawara, Kawasaki, Japan

[73] Assignee: Kabushiki Kaisha Toshiba, Kawasaki, Japan

[21] Appl. No.: 128,139

[22] Filed: Sep. 29, 1993

[30] Foreign Application Priority Data

Sep. 29, 1992 [JP] Japan .................................. 4-259635

[51] Int. Cl.$^6$ .................................................. H01S 3/18
[52] U.S. Cl. ................................................ 372/46; 372/96
[58] Field of Search ................................ 372/43, 45, 46, 372/96, 50, 44, 99

[56] References Cited

U.S. PATENT DOCUMENTS

| | | | |
|---|---|---|---|
| 5,138,404 | 8/1992 | Ishikawa et al. | 257/90 |
| 5,182,757 | 1/1993 | Mori et al. | 372/46 |
| 5,245,622 | 9/1993 | Jewell et al. | 372/46 |
| 5,343,487 | 8/1994 | Scott et al. | 372/45 |

OTHER PUBLICATIONS

Applied Physics Lett. 62 pgs. 2027–2029 (1993) T. J. Rogers, et al. Low Threshold Voltage Continuous Wave Vertical–Cavity Surface–Emitting Lasers Apr. 26.
Jpn. J. Appl. Pys. 27 L2414–L2416 (1988) K. Itaya, et al. Dec. 1988 A New Trnasverse–Mode Stabilized In GaAIP Visible Light Laser Diode Using P—P Isotype Heterobarrier Blocking (Dec.).

Primary Examiner—Rodney B. Bovernick
Assistant Examiner—Robert McNutt
Attorney, Agent, or Firm—Oblon, Spivak, McClelland, Maier, & Neustadt

[57] ABSTRACT

A surface emission type semiconductor light-emitting device includes a substrate, a distributed Bragg reflector formed on the substrate, a light-emitting region formed on the distributed Bragg reflector, a first contact layer, formed on a portion of the light-emitting region and transparent to a wavelength of light emitted from the light-emitting region, for supplying a current to the light-emitting region, and a second contact layer, formed on the light-emitting region to cover a side portion of the first contact layer, for forming a current blocking barrier between the light-emitting region and the second contact layer and supplying the current to the first contact layer.

18 Claims, 2 Drawing Sheets

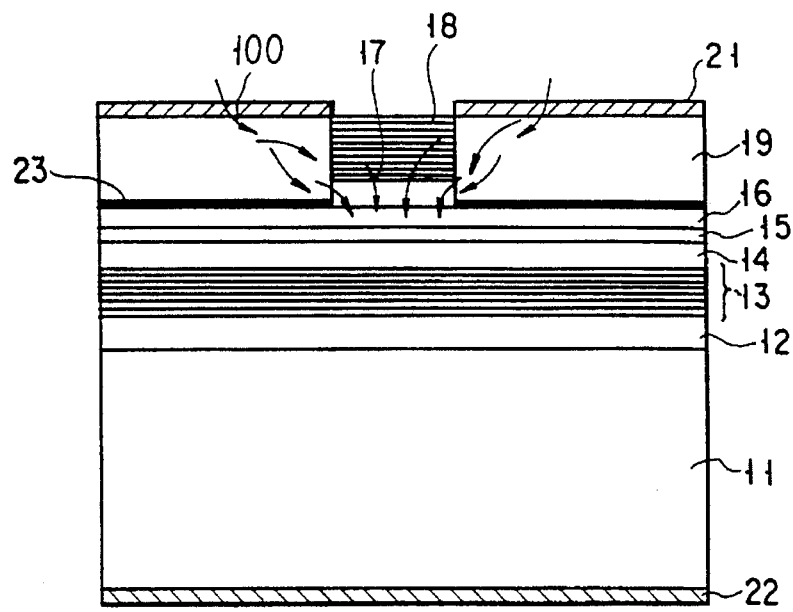
F I G. 1
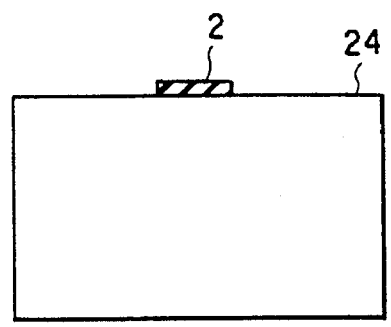
F I G. 2A
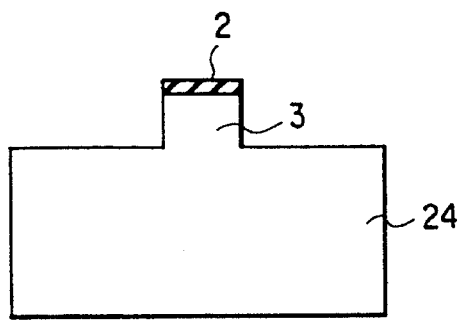
F I G. 2B
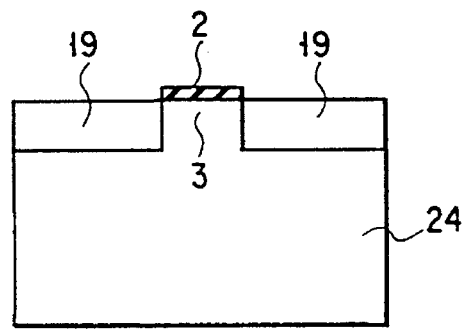
F I G. 2C

SURFACE EMISSION TYPE SEMICONDUCTOR LIGHT-EMITTING DEVICE

BACKGROUND OF THE INVENTION

1. Field of the Invention

The present invention relates to a surface emission type semiconductor light-emitting device using a compound semiconductor material and a method of manufacturing the same.

2. Description of the Related Art

In recent years, short-wave-length semiconductor lasers have been developed for a variety of applications such as a high-density optical disk system, a high-speed laser printer and a bar-code reader. Of the short-wavelength semiconductor lasers, an InGaAlP-based semi-conductor laser, having an oscillation wave-length in 0.6 μm band (red), has received a great deal of attention as a promising short-wavelength semiconductor laser.

On the other hand, extensive studies have been made on a surface emission type semiconductor laser having an advantage in integration, and good beam and longitudinal mode characteristics. The above-mentioned InGaAlP material is promising to shorten the wavelength of the surface emission type semiconductor laser into a visible light range. In addition, it is essential to form a Bragg reflector constituted by semiconductor layers on the upper and lower surfaces of a substrate in order to realize a high yield and good element formation reproducibility.

However, the surface emission type semiconductor laser having a Bragg reflector consisting of the InGaAlP material has very high electrical resistance. That is because the band discontinuity of a heterojunction, having different compositions constituting the Bragg reflector, is large on the valence band side, and accordingly, the resulting heterospike prevents hole carriers from being injected. For this reason, the electrical resistance of the device becomes as large as 20Ω or more. With such a large electrical resistance, laser oscillation is difficult, and even if oscillation occurs, device reliability is greatly degraded.

SUMMARY OF THE INVENTION

It is an object of the present invention to provide an excellent surface emission type semiconductor light-emitting device having a sufficiently low electrical resistance, and a simple method of manufacturing the same.

According to the present invention, there is provided a surface emission type semiconductor light-emitting device comprising a substrate, a distributed Bragg reflector formed on the substrate, a light-emitting region formed on the distributed Bragg reflector, a first contact layer, formed on a portion of the light-emitting region and transparent to a wavelength of light emitted from the light-emitting region, for supplying a current to the light-emitting region and a second contact layer, formed on the light-emitting region to cover a side portion of the first contact layer, for forming a current blocking barrier between the light-emitting region and the second contact layer and for supplying the current to the first contact layer.

In addition, according to the present invention, there is provided a method of manufacturing a surface emission type semiconductor light-emitting device, comprising the steps of sequentially forming a distributed Bragg reflector and a light-emitting region on a substrate; forming, on a portion of the light-emitting region, a first contact layer transparent to a wavelength of light emitted from the light-emitting region to supply a current to the light-emitting region; and forming, on an exposed surface of the light-emitting region, a second contact layer for forming a current blocking barrier between the light-emitting region and the second contact layer and for supplying the current to the first contact layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a surface emission type semiconductor laser according to the first embodiment of the present invention;

FIGS. 2A to 2C are sectional views showing steps in the manufacture of the semiconductor laser shown in FIG. 1;

DETAILED DESCRIPTION OF THE PREFERRED EMBODIMENTS

Figure 3:
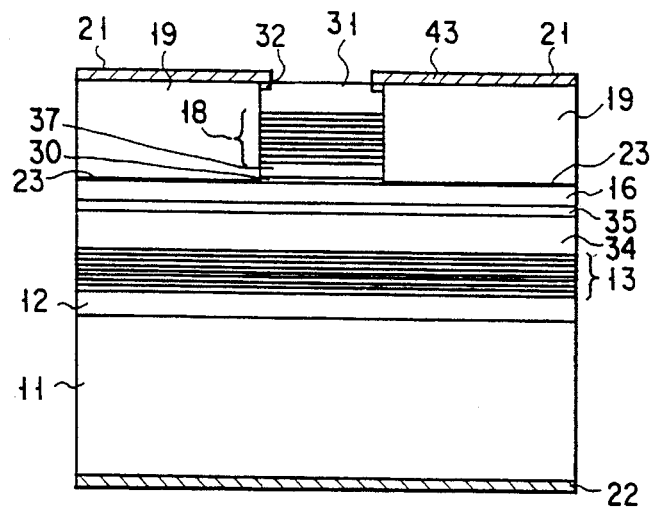
FIG. 3 is a sectional view showing a surface emission type semiconductor laser according to the second embodiment of the present invention.

The preferred embodiments of the present invention will be described below.

A surface emission type semiconductor light-emitting device of the present invention is characterized by comprising; a substrate, a distributed Bragg reflector formed on the substrate, a light-emitting region formed on the distributed Bragg reflector, a first contact layer, formed on a portion of the light-emitting region and transparent to a wavelength of light emitted from the light-emitting region, for supplying a current to the light-emitting region, and a second contact layer, formed on the light-emitting region to cover a side portion of the first contact layer, for forming a current blocking barrier between the light-emitting region and the second contact layer and supplying the current to the first contact layer.

The light-emitting region is a region for recombining the injected carriers, i.e., electrons and holes in order to cause light emission and for holding the light in a desired region. More specifically, the light-emitting region has a structure in which an active layer is formed between p-type and n-type layers, and if desired, a heterojunction is also formed.

The first and second contact layers preferably consist of a material having a low resistivity in order to facilitate the current flow. The second contact layer preferably has a large band gap difference with respect to a cladding layer for the sake of current confinement. The second layer preferably has a very low resistivity for lateral injection from the first contact layer. Especially, the resistivity of the second contact layer is preferably as low as 1/10 or less than that of the adjacent light-emitting region (upper cladding layer). Under these conditions, the current diffuses sufficiently enough in the lateral direction within the first contact layer, to obtain a uniform current density, thereby uniformly and smoothly performing current injection in the light-emitting region through the first and second contact layers.

According to the present invention, current constriction is performed by the heterojunction between the second contact layer and the light-emitting region, so that a special semiconductor layer for current confinement is not required in order to realize a simple device structure. The current injection from the side region of the first contact layer enables to decrease a series resistance, thereby avoiding an increase in electrical resistance caused by the Bragg reflector. In addition, the second contact layer is selectively formed on the light-emitting region exposed from the island-like first contact layer, thereby preventing the manufacturing steps from being complicated.

The detailed embodiments of the present invention will be described below with reference to the accompanying drawings.

First Embodiment

FIG. 1 is a sectional view for explaining the schematic structure of a surface emission type semiconductor laser device according to the first embodiment of the present invention. Referring to FIG. 1, reference numeral 11 denotes an n-GaAs substrate. A buffer layer 12 consisting of n-GaAs is formed on the substrate 11. A Bragg reflector 13 is formed on the buffer layer 12. The Bragg reflector is constituted by the alternate stacking of 30 pairs of n-In$_{0.5}$(Ga$_{0.9}$Al$_{0.1}$)$_{0.5}$P layers (Si-doped; $3\times10^{17}$ cm$^{-3}$ to $5\times10^{17}$ cm$^{-3}$) and n-In$_{0.5}$Al$_{0.5}$P layers (Si-doped; $3\times10^{17}$ cm$^{-3}$ to $5\times10^{17}$ cm$^{-3}$). A double heterostructure constituted by a lower cladding layer 14 (Si-doped; $3\times10^{17}$ cm$^{-3}$ to $5\times10^{17}$ cm$^{-3}$) consisting of n-In$_{0.5}$(Ga$_{0.3}$Al$_{0.7}$)$_{0.5}$P, an active layer 15 (undoped) consisting of In$_{0.5}$Ga$_{0.5}$P and an upper cladding layer 16 (Zn-doped; $3\times10^{17}$ cm$^{-3}$ to $5\times10^{17}$ cm$^{-3}$) consisting of p-In$_{0.5}$(Ga$_{0.3}$Al$_{0.7}$)$_{0.5}$P formed on the Bragg reflector 13. The double heretostructure constitutes a light-emitting region.

A first contact layer 17 (Zn-doped; $1\times10^{18}$ cm$^{-3}$ to $3\times10^{18}$ cm$^{-3}$) consisting of p-GaAlAs is formed on a portion of the upper cladding layer 16. A Bragg reflector 18 is formed on the first contact layer 17. The Bragg reflector 18 is constituted by alternately stacking 39 pairs of AlAs layers (Zn-doped; $1\times10^{18}$ cm$^{-3}$) and Ga$_{0.6}$Al$_{0.4}$As layers (Zn-doped; $1\times10^{18}$ cm$^{-3}$). A ridge is formed by the first contact layer 17 and the Bragg reflector 18.

A second contact layer 19 (Zn-doped; $5\times10^{18}$ cm$^{-3}$), consisting of p-GaAs, is formed on the side surface of the ridge. A metal electrode 21 is formed on the upper surface of the second contact layer 19. A metal electrode 22 is formed on the lower surface of the substrate 11.

The upper cladding layer 16 has a thickness of 0.4 μm. The active layer 14 has a thickness of 2.0 μm. The first contact layer 17 has a thickness of 1 μm. The ridge has a diameter of 20 μm. Crystal growth of each layer is performed by the MOCVD method.

In this laser; structure parameters, a material composition, and a carrier concentration must be properly set to sufficiently reduce the electrical resistance of the device. These are exemplified by above-described values.

ZnS or MgSe having a large band gap may be used as a semiconductor layer.

Current injection indicated by arrows 100 is performed from the electrode 21 via the second contact layer 19, which consists of p-GaAs, through the side surface of the Bragg reflector 18 and the side surface of the first contact layer 17 consisting of p-GaAlAs. For this reason, the carrier concentration of the first contact layer 17 consisting of p-GaAlAs is set relatively high. The Al content is given as 0.5 so as to avoid causing a loss of light of the emission wavelength.

In this embodiment, a heterobarrier 23, formed in the InGaAlP/GaAs heterojunction between the upper cladding layer 16 and the second contact layer 19, prevents the current from being injected, thereby performing current confinement.

A method of manufacturing the surface emission type semiconductor laser shown in FIG. 1 will be described below with reference to FIGS. 2A to 2C. First, the buffer layer 12 consisting of n-GaAs; the Bragg reflector 13 constituted by alternately stacking 30 pairs of n-In$_{0.5}$(Ga$_{0.9}$Al$_{0.1}$)$_{0.5}$P layers (Si-doped; $3\times10^{17}$ cm$^{-3}$ to $5\times10^{17}$ cm$^{-3}$) and n-In$_{0.5}$Al$_{0.5}$P layers (Si-doped; $3\times10^{17}$ cm$^{-3}$ to $5\times10^{17}$ cm$^{-3}$); the lower cladding layer 14 (Si-doped; $3\times10^{17}$ cm$^{-3}$ to $5\times10^{17}$ cm$^{-3}$) consisting of n-In$_{0.5}$(Ga$_{0.3}$Al$_{0.7}$)$_{0.5}$P; the active layer 15 (undoped) consisting of In$_{0.5}$Ga$_{0.5}$P; the upper cladding layer 16 (Zn-doped; $3\times10^{17}$ cm$^{-3}$ to $5\times10^{17}$ cm$^{-3}$) consisting of p-In$_{0.5}$(Ga$_{0.3}$Al$_{0.7}$)$_{0.5}$P; the first contact layer 17 (Zn-doped; $1\times10^{18}$ cm$^{-3}$ to $3\times10^{18}$ cm$^{-3}$) consisting of p-GaAlAs and the Bragg reflector 18, constituted by alternately stacking 39 pairs of AlAs layers (Zn-doped; $1\times10^{18}$ cm$^{-3}$) and Ga$_{0.6}$Al$_{0.4}$As layers (Zn-doped; $1\times10^{18}$ cm$^{-3}$), are sequentially grown on the n-GaAs substrate 11. Referring to FIG. 2A, reference numeral 24 denotes a resultant multilayered structure. A dielectric is then deposited on the Bragg reflector 18 and patterned into a desired shape to leave a dielectric film 2 (FIG. 2A).

The multilayered structure is etched by using the dielectric film 2 as a mask until the upper cladding layer 16 (not shown) is exposed, thereby forming a columnar ridge 3 (FIG. 2B). The second contact layer 19 is selectively grown on the exposed surface of the upper cladding layer 16 by the MOCVD method (FIG. 2C). The dielectric film 2 is then removed, the electrode 21 is formed on the second contact layer 19, and the electrode 22 is formed on the lower surface of the substrate 11, thereby completing the surface emission type semiconductor laser shown in FIG. 1.

In the surface emission type semiconductor laser shown in FIG. 1, current confinement is performed by the heterobarrier between the p-type layers as described above. Therefore, a special layer for current confinement such as an n-type current blocking layer or high-resistance layer is not required, so that the device can be manufactured by a very simple process as shown in FIGS. 2A to 2C. In the conventional surface emission type semiconductor laser in which current confinement is performed by an n-type current blocking layer, the electrical resistance of the device is 20Ω or more. In this embodiment, however, the electrical resistance is as low as 5Ω. The operating voltage is also as low as 2.5 to 3.0 V, in comparison with the conventional device.

The band gap difference between the upper cladding layer 16 and the second contact layer 19 is important for obtaining a satisfactory heterobarrier effect for current confinement. The band gap difference of 0.6 eV or more, generates a large voltage drop. In a combination of the upper cladding layer 16 and the second contact layer 19 each consisting of a material having large band discontinuity on the valence band side, a more reliable effect can be obtained. As the material combination, not only InGaAs/GaAs as in this embodiment, but also ZnSe/GaAs may be used. The present invention has an advantage in a laser having an active layer consisting of InGaAs or GaAlAs. In addition, the cladding layer is not limited to InGaAlP, and InAlP may also be used.

Second Embodiment

FIG. 3 is a sectional view showing the schematic structure of a surface emission type semiconductor laser device according to the second embodiment of the present invention. The same reference numerals as in the first embodiment denote the same parts in the second embodiment, and a detailed description thereof will be omitted.

The semiconductor laser device according to the second embodiment is different from that according to the first embodiment in the following points.

(1) An active layer serving as the main part of a light-emitting region has an MQW structure in which 10 pairs of well layers consisting of InGaP and barrier layers, consisting of $In_{0.5}(Ga_{0.5}Al_{0.5})_{0.5}P$, are alternately stacked. The well layers employ strained structures with a lattice mismatch value of +2%.

(2) A first contact layer 37 is formed on an upper cladding layer 16 through a heterobarrier reduction layer 30 (Zn-doped; $1\times10^{18}$ cm$^{-3}$), consisting of p-InGaP.

(3) A second contact layer 31 consisting of p-GaAlAs and a third contact layer 32 (Zn-doped; $1\times10^{18}$ cm$^{-3}$ to $3\times10^{18}$ cm$^{-3}$) consisting of p-GaAs are formed on a Bragg reflector 18.

With this structure, the semiconductor laser device according to this embodiment provides the same effect as that of the first embodiment, and the following effect can also be obtained.

The active layer of the MQW structure allows a low-threshold operation, and the electrical resistance can be furthermore reduced because of the effect of the heterobarrier reduction layer and an increase in contact area.

Figure 4:
FIG. 4 is a sectional view showing a surface emission type semiconductor laser using a thin film multilayer as a buffer layer.

In the semiconductor laser device according to this embodiment, when a structure, in which ZnTe layers 40 and InGaAlP layers 41 are alternately stacked, is used as a buffer layer 12, as shown in FIG. 4, the voltage becomes as low as 3.0 V. More specifically, 5 pairs of p-ZnTe layers 40, each having a thickness of 300 nm and p-InGaAlP layers 41, each having a thickness of 500 nm, are alternately stacked. Holes are tunneled by a quantum effect which is due to such a thin film multilayer, and smoothly injected.

Third Embodiment

Figure 5:
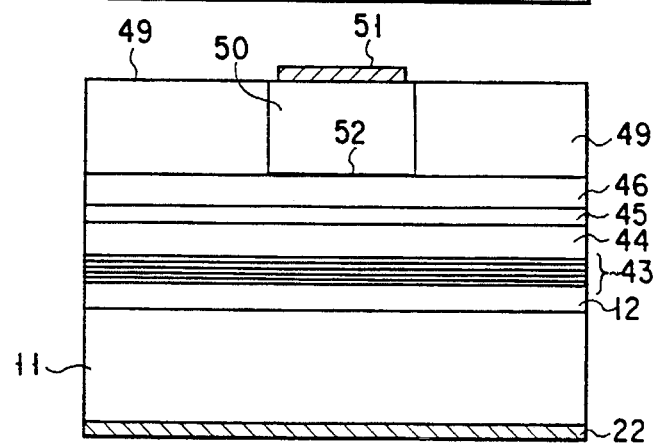
FIG. 5 is a sectional view showing a surface emission type LED according to the third embodiment of the present invention.

FIG. 5 is a sectional view showing a schematic structure of a surface emission type LED according to the third embodiment of the present invention. Each portion of the LED will be described below in association with manufacturing steps.

Referring to FIG. 5, reference numeral 11 denotes an n-GaAs substrate. A buffer layer 12 consisting of n-GaAs, and a Bragg reflector 43, constituted by alternately stacking 30 pairs of n-GaAs layers (Si-doped; $3\times10^{17}$ cm$^{-3}$ to $5\times10^{17}$ cm$^{-3}$) and n-$In_{0.5}Al_{0.5}P$ layers (Si-doped; $3\times10^{17}$ cm$^{-3}$ to $5\times10^{17}$ cm$^{-3}$), are formed on the substrate 11.

Next, a double heterostructure, constituted by a lower cladding layer 44 (Si-doped; $3\times10^{17}$ cm$^{-3}$ to $5\times10^{17}$ cm$^{-3}$) consisting of n-$In_{0.5}(Ga_{0.3}Al_{0.7})_{0.5}P$, an active layer 45 (undoped) consisting of $In_{0.5}(Ga_{0.6}Al_{0.4})_{0.5}P$, and an upper cladding layer 46 (Zn-doped; $3\times10^{17}$ cm$^{-3}$ to $5\times10^{17}$ cm$^{-3}$) consisting of P-$In_{0.5}(Ga_{0.3}Al_{0.7})_{0.5}P$, is formed on the Bragg reflector 43 as a light-emitting region.

A current spreading layer 49 (Zn-doped; $1\times10^{18}$ cm$^{-3}$ to $3\times10^{18}$ cm$^{-3}$) consisting of p-GaAlAs is formed on the upper cladding layer 46 as a first contact layer. After a layer serving as the current spreading layer 49 is formed on the entire surface of the cladding layer 46, its central portion is etched to form a circular hole, thereby forming the current spreading layer 49.

Thereafter, a second contact layer 50 (Zn-doped; $5\times10^{18}$ cm$^{-3}$) consisting of p-GaAs is selectively grown in the hole. A metal electrode 51 is formed on the upper surface of the second contact layer 50, and a metal electrode 22 is formed on the lower surface of the substrate 11, thereby completing the surface emission type LED.

In the LED of the above structure, a heterobarrier 52 is formed at the interface between the second contact layer 50 consisting of p-GaAs and the upper cladding layer 46. The current does not flow because of the heterobarrier 52, thereby preventing an injected current from flowing in a portion immediately under the electrode. Therefore, the surface emission type LED, according to the third embodiment, provides the same effect as the surface emission type semiconductor laser device according to the first embodiment. In the LED spreading according to the third embodiment, the current spreading layer, consisting of GaAlAs, can be continuously grown in the first sequence of crystal growth, so that a good morphology can be obtained.

Fourth Embodiment

Figure 6:
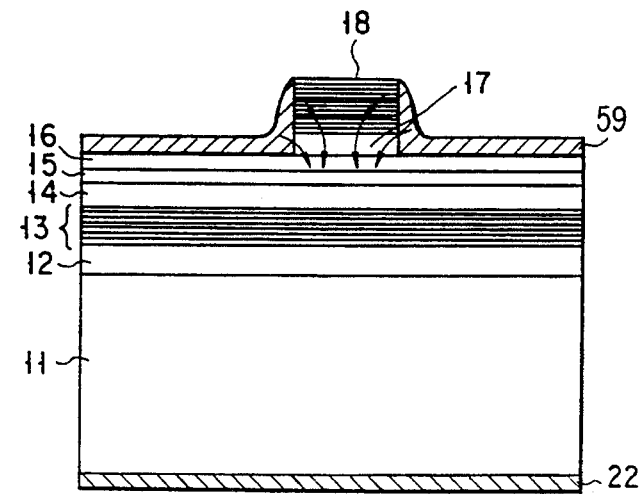
FIG. 6 is a sectional view showing a surface emission type semiconductor laser according to the fourth embodiment of the present invention.

FIG. 6 is a sectional view showing a schematic structure of a surface emission type semiconductor laser device, according to the fourth embodiment of the present invention. The same reference numerals as in the first embodiment denote the same parts in the fourth embodiment, and a detailed description thereof will be omitted.

In the semiconductor laser device according to the fourth embodiment, a metal electrode 59 is formed, instead of the second contact layer 19 consisting of a semiconductor in the semiconductor laser device according to the first embodiment. More specifically, current confinement is performed not by a heterobarrier but by a Schottky barrier, formed at the interface between the metal electrode 59 and an upper cladding layer 16. Good ohmic contact can be obtained at the interface between the metal electrode 59 and a first contact layer 17.

Any metal which can form the Schottky barrier between itself and the upper cladding layer 16 is suitable for use as the metal electrode 59. For example, gold or a gold-zinc alloy can be used.

In this embodiment, crystal growth is completed in a single step.

The present invention is not limited to the above-described embodiments. The following changes can be made without departing from the spirit and scope of the invention.

(1) The material constituting the substrate, the active layer, or the cladding layer is not limited to a III–V group compound semiconductor. It may be another compound semiconductor such as a IV—IV group represented by SiGe, or a II–VI group represented by ZnSe, CdZnSeS, ZnMgSeS and ZnMgTeSe.

(2) Although single element devices are exemplified in the above embodiments, the present invention can be applied to an integrated surface-emitting device. The present invention also has a great advantage in a micro-optical device such as a micro-cavity laser.

As has been described above, according to the present invention, it is possible to provide a surface emission type semiconductor light-emitting device which has sufficiently low electrical resistance and which is easily produced due to a simple manufacturing method.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A surface emission type semiconductor light-emitting device comprising:
   a substrate;
   a distributed Bragg reflector formed on said substrate;
   a light-emitting region formed on said distributed Bragg reflector;
   a first contact layer, formed on a portion of said light-emitting region and transparent to a wavelength of light emitted from said light-emitting region, for supplying a current to said light-emitting region;
   a second contact layer, formed on said light-emitting region to cover a side portion of said first contact layer, for supplying the current to said first contact layer, and
   an electrode, formed on said second contact layer, for supplying the current to said second contact layer,
   wherein a current blocking barrier is formed between said light-emitting region and said second contact layer, thereby preventing the current from being injected into said light-emitting region from said second contact layer.

2. A device according to claim 1, wherein said second contact layer essentially consists of a material having a resistivity not more than 1/10 of that of a portion of said light-emitting region in contact with said second contact layer.

3. A device according to claim 1, wherein said second contact layer essentially consists of a semiconductor for forming a heterobarrier between said light-emitting region and said second contact layer.

4. A device according to claim 3, wherein said second contact layer essentially consists of GaAs, and a portion of said light-emitting region, in contact with said second contact layer, essentially consists of a compound semiconductor selected from the group consisting of InGaAlP, InAlP, ZnSe, CdZnSeS, ZnMgSeS and ZnMgTeSe.

5. A device according to claim 1, wherein said second contact layer essentially consists of a metal for forming a Schottky barrier between said light-emitting region and said second contact layer.

6. A device according to claim 5, wherein said second contact layer essentially consists of one of Au and Au-Zn alloy.

7. A device according to claim 1, wherein said light-emitting region has a double heterostructure comprising a lower cladding layer, an active layer, and an upper cladding layer.

8. A device according to claim 7, wherein said lower cladding layer essentially consists of one of first conductivity types InGaAlP and InAlP, said active layer essentially consists of a compound semiconductor selected from the group consisting of InGaP, InGaAs, GaAlAs, and ZnGaAsP, and said upper cladding layer essentially consists of one of second conductivity types InGaAlP and InAlP.

9. A device according to claim 1, wherein said active layer comprises a quantum well structure.

10. A device according to claim 9, wherein said quantum well structure is constituted by stacking a plurality of pairs of well layers essentially consisting of InGaP and barrier layers essentially consisting of InGaAlP.

11. A surface emission type semiconductor laser according to claim 1, wherein said first contact layer is formed on a central portion of said light-emitting region.

12. A surface emission type semiconductor light-emitting diode according to claim 1, wherein said first contact layer is formed on a portion of said light-emitting region except for a central portion thereof.

13. A device according to claim 1, wherein said distributed Bragg reflector is constituted by alternately stacking a plurality of pairs of InGaAlP layers and InAlP layers.

14. A surface emission type semiconductor light-emitting device comprising:
    a substrate;
    a distributed Bragg reflector formed on said substrate;
    a light-emitting region formed on said distributed Bragg reflector;
    a first contact layer, formed on a portion of said light-emitting region and transparent to a wavelength of light emitted from said light-emitting region, for supplying a current to said light-emitting region;
    a second contact layer, formed on said light-emitting region to cover a side portion of said first contact layer, for supplying the current to said first contact layer, and
    an electrode, formed on said second contact layer, for supplying the current to said second contact layer,
    wherein said second contact layer essentially consists of a material having a bad gap smaller than that of a portion of said light-emitting region in contact with said second contact layer so as to form a current blocking barrier between said light-emitting region and said second contact layer, thereby preventing the current from being injected into said light-emiting region from the second contact layer.

15. A method of manufacturing a surface emission type semiconductor light-emitting device, comprising:
    a distributed Bragg reflector formation step of sequentially forming a distributed Bragg reflector and a light-emitting region on a substrate;
    a first contact layer formation step of forming, on a portion of said light-emitting region, a first contact layer transparent to a wavelength emitted from said light-emitting region to supply a current to said light-emitting region;
    a second contact layer formation step of forming, on an exposed surface of said light-emitting region, a second contact layer for supplying the current to said first contact layer, and an electrode formation step of forming, on said second contact layer, an electrode for supplying the current to said second contact layer, wherein a current blocking barrier is formed between said light-emitting region and said second contact layer, thereby preventing the current from being injected into said light-emitting region.

16. A method according to claim 15, wherein the first contact layer formation step comprises performing selective removal of a deposited layer after a material constituting said first contact layer is deposited on an entire surface of said light-emitting region, and the second contact layer formation step comprises performing selective growth of a material constituting said second contact layer on said exposed portion of said light-emitting region.

17. A method according to claim 15, wherein the selective removal comprises leaving a central portion of said deposited layer.

18. A method according to claim 15, wherein the selective removal comprises forming a hole in a central portion of said deposited layer.

* * * * *